United States Patent
Huang et al.

(10) Patent No.: US 10,453,677 B2
(45) Date of Patent: Oct. 22, 2019

(54) METHOD OF FORMING OXIDE LAYER

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Cheng-Hsu Huang, New Taipei (TW); Jui-Min Lee, Taichung (TW); Ching-Hsiang Chang, Tainan (TW); Yi-Wei Chen, Taichung (TW); Wei-Hsin Liu, Changhua (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/644,821

(22) Filed: Jul. 9, 2017

(65) Prior Publication Data
US 2018/0366323 A1   Dec. 20, 2018

(30) Foreign Application Priority Data

Jun. 16, 2017   (CN) .......................... 2017 1 0455943

(51) Int. Cl.
*H01L 21/02* (2006.01)
*H01L 21/76* (2006.01)
(Continued)

(52) U.S. Cl.
CPC .... *H01L 21/02282* (2013.01); *H01L 21/0206* (2013.01); *H01L 21/02307* (2013.01); *H01L 21/02312* (2013.01); *H01L 21/02323* (2013.01); *H01L 21/02337* (2013.01); *H01L 21/76229* (2013.01); *H01L 21/76237* (2013.01);
(Continued)

(58) Field of Classification Search
CPC ......... H01L 21/02282; H01L 21/02312; H01L 21/02315; H01L 21/02323; H01L 21/02337; H01L 21/02359; H01L 21/76237; H01L 21/76826; H01L 21/76229; H01L 21/0206; H01L 21/02301; H01L 21/02307; H01L 21/76224–76237; H01L 21/76822–76828; H01L 27/10894; H01L 27/10897; H01L 27/10876;
(Continued)

(56) References Cited

U.S. PATENT DOCUMENTS 7,517,817 B2    4/2009   Goo
7,807,543 B2 *  10/2010  Shin ................. H01L 21/76229
                                              257/E21.546
(Continued)

*Primary Examiner* — Michael M Trinh
(74) *Attorney, Agent, or Firm* — Winston Hsu

(57) ABSTRACT

A method of forming an oxide layer includes the following steps. A substrate is provided. A surface of the substrate is treated to form an oxygen ion-rich surface. A spin-on-dielectric layer is formed on the oxygen ion-rich surface of the substrate. The present invention also provides a method of forming an oxide layer including the following steps. A substrate is provided. A surface of the substrate is treated with a hydrogen peroxide ($H_2O_2$) solution or a surface of the substrate is treated with oxygen containing gas, to form an oxygen ion-rich surface. A spin-on-dielectric layer is formed on the oxygen ion-rich surface of the substrate.

14 Claims, 5 Drawing Sheets

(51) Int. Cl.
*H01L 21/762* (2006.01)
*H01L 27/108* (2006.01)

(52) U.S. Cl.
CPC .. *H01L 27/10823* (2013.01); *H01L 27/10876* (2013.01); *H01L 27/10885* (2013.01); *H01L 27/10888* (2013.01); *H01L 27/10891* (2013.01); *H01L 27/10894* (2013.01); *H01L 27/10897* (2013.01); *H01L 27/10814* (2013.01)

(58) Field of Classification Search
CPC .......... H01L 27/10823; C23C 18/1254; C23C 2218/116; B05D 1/005
See application file for complete search history.

(56) References Cited

U.S. PATENT DOCUMENTS

| | | | |
|---|---|---|---|
| 8,420,541 B2* | 4/2013 | Shih | H01L 21/02164 |
| | | | 257/E21.24 |
| 8,501,632 B2* | 8/2013 | Stapelmann | H01L 21/3105 |
| | | | 438/758 |
| 2006/0102977 A1* | 5/2006 | Fucsko | H01L 21/02236 |
| | | | 257/499 |
| 2014/0057458 A1 | 2/2014 | Park | |
| 2014/0159171 A1* | 6/2014 | Cai | H01L 29/785 |
| | | | 257/412 |
| 2015/0140717 A1* | 5/2015 | Urban | B81C 1/00388 |
| | | | 438/50 |
| 2016/0254143 A1* | 9/2016 | Hanawa | H01L 21/02315 |
| | | | 438/763 |

* cited by examiner

METHOD OF FORMING OXIDE LAYER

BACKGROUND OF THE INVENTION

1. Field of the Invention

The present invention relates generally to a method of forming an oxide layer, and more specifically to a method of forming an oxide layer applying a spin-on dielectric (SOD) process.

2. Description of the Prior Art

Spin-on dielectric (SOD) processes or chemical vapor deposition (CVD) processes are widely used for depositing dielectrics. Due to flowable dielectrics used in spin-on dielectric (SOD) processes can fill up recesses in a substrate easily by adjusting the solutions of the flowable dielectrics, spin-on dielectric (SOD) process becomes a major way to deposit dielectrics.

For a semiconductor structure, trenches with various sizes are set on a substrate. As the flowable dielectric is spin-coated on the substrate through a spin-on dielectric (SOD) process, the flowable dielectric should fill up the trenches in the substrate. However, the dielectrics formed from the flowable dielectrics would have defects such as voids often occurring at the bottom of the dielectrics. Therefore, it becomes a serious issue to eliminate the voids.

SUMMARY OF THE INVENTION

The present invention provides a method of forming an oxide layer, which forms an oxygen ion-rich surface, and then forms an oxide layer on the surface, thereby improving gap filling quality of the oxide layer.

The present invention provides a method of forming an oxide layer including the following steps. A substrate is provided. A surface of the substrate is treated to form an oxygen ion-rich surface. A spin-on-dielectric layer is formed on the oxygen ion-rich surface of the substrate.

The present invention provides a method of forming an oxide layer including the following steps. A substrate is provided. A surface of the substrate is treated with a hydrogen peroxide ($H_2O_2$) solution to form an oxygen ion-rich surface. A spin-on-dielectric layer is formed on the oxygen ion-rich surface of the substrate.

The present invention provides a method of forming an oxide layer including the following steps. A substrate is provided. A surface of the substrate is treated with oxygen containing gas to form an oxygen ion-rich surface. A spin-on-dielectric layer is formed on the oxygen ion-rich surface of the substrate.

According to the above, the present invention provides a method of forming an oxide layer, which treats a surface of a substrate by a dry treatment process or a wet treatment process to form an oxygen ion-rich surface, and then forms an oxide layer on the surface. By doing this, a flowable dielectric used for forming the oxide layer can be transformed completely, especially for the flowable dielectric being transformed at the bottom of a recess completely. Therefore, this improves gap filling of the oxide layer, avoids voids in the oxide layer, and enhances the material uniformity of the oxide layer.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-5 schematically depict cross-sectional views of a method of forming an oxide layer according to an embodiment of the present invention. FIGS. 1-5 depict isolations, which are formed by the method of forming an oxide layer of the present invention and are used for separating recessed dynamic random access memory (DRAM) cells from each other, but the present invention is not restricted thereto.

Figure 1:
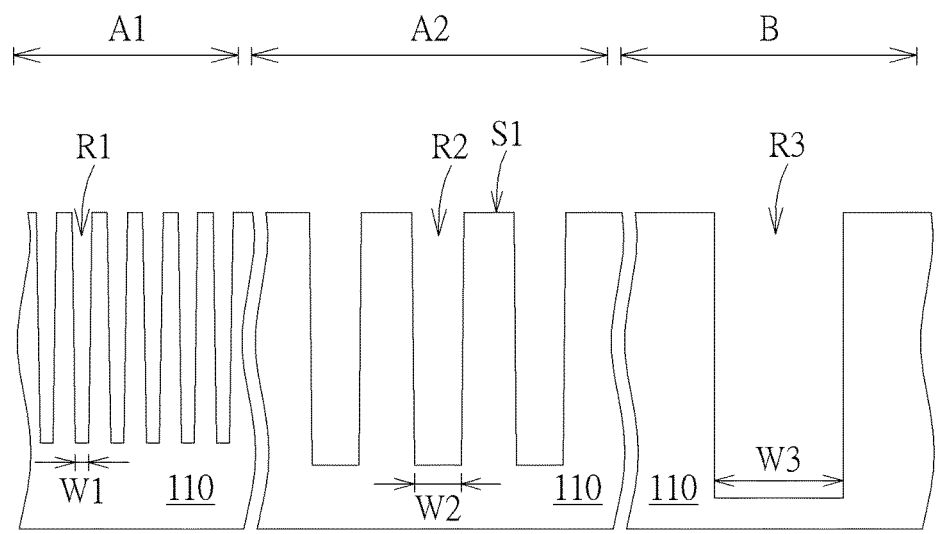
FIGS. 1-5 schematically depict cross-sectional views of a method of forming an oxide layer according to an embodiment of the present invention.

As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 may be divided into a first area A1, a second area A2 and a third area B, depending upon their functions. For instance, the first area A1 and the second area A2 may be memory cell areas while the third area B may be a periphery area, wherein the circuits in the periphery area are used for operating the memory cells in the memory cell areas, but it is not limited thereto. In this embodiment, a plurality of memory cells are in the memory cell areas, thereby a recessed dynamic random access memory (DRAM) device being formed, but it is not limited thereto.

A plurality of recesses R1 are in the substrate 110 of the first area A1, a plurality of recesses R2 are in the substrate 110 of the second area A2, and a recess R3 is in the substrate 110 of the third area B. There are six recesses R1, three recesses R2 and one recess R3 depicted in FIGS. 1-5, but the number of the recesses R1/R2/R3 are not restricted thereto. Widths W1 of the recesses R1 are less than widths W2 of the recesses R2, and the widths W2 of the recesses R2 are less than a width W3 of the recess R3. The widths W1/W2/W3 of the recesses R1/R2/R3 depend upon sizes of devices required being isolated.

Methods of forming the recesses R1/R2/R3 include the following. A plurality of pad layers (not shown), an etch stop layer (not shown) and a hard mask layer (not shown) are formed sequentially and blanketly; the hard mask layer (not shown), the etch stop layer (not shown) and the pad layers (not shown) are patterned to expose a part of the substrate 110 and thus define the locations of the recesses R1/R2/R3; the exposed part of the substrate 110 are etched to form the recesses R1/R2/R3; the hard mask layer (not shown), the etch stop layer (not shown) and the pad layers (not shown) are removed. Methods of forming the recesses R1/R2/R3 are not restricted thereto.

Figure 2:
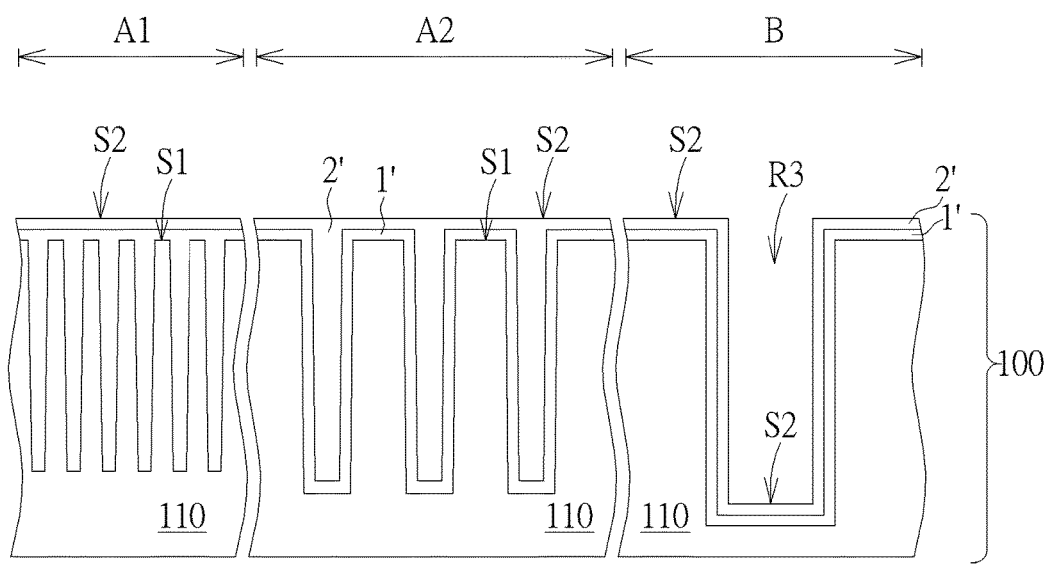

As shown in FIG. 2, a liner may selectively cover a surface S1 of the substrate 110. In this embodiment, the liner may include an oxide liner 1' and a nitride liner 2' from bottom to top, but it is not limited thereto. In one case, the liner is a dual layer, but the liner may be one single layer or more than two layers in other cases. For example, the liner may be only one oxide liner 1' or only one nitride liner 2'. The oxide liner 1' and the nitride liner 2' may be formed by methods such as anatomic layer deposition (ALD) process, but it is not limited thereto. In other words, a substrate 100 may selectively include the substrate 110, the oxide liner 1' and the nitride liner 2', and the nitride liner 2' is located at a surface S2 of the substrate 100.

In another case, the liner may include a carbon containing nitride liner and an oxynitride liner from bottom to top, but it is not limited thereto. In one case, the liner is a dual layer, but the liner may be one single layer or more than two layers in other cases. For example, the liner may be only one carbon containing nitride liner or only one oxynitride liner. The carbon containing nitride liner and the oxynitride liner may be formed by methods such as an atomic layer deposition (ALD) process, but it is not limited thereto. Therefore, the substrate 100 may selectively include the substrate 110, the carbon containing nitride liner and the oxynitride liner, and the oxynitride liner is located at the surface S2 of the substrate 100.

Figure 3:
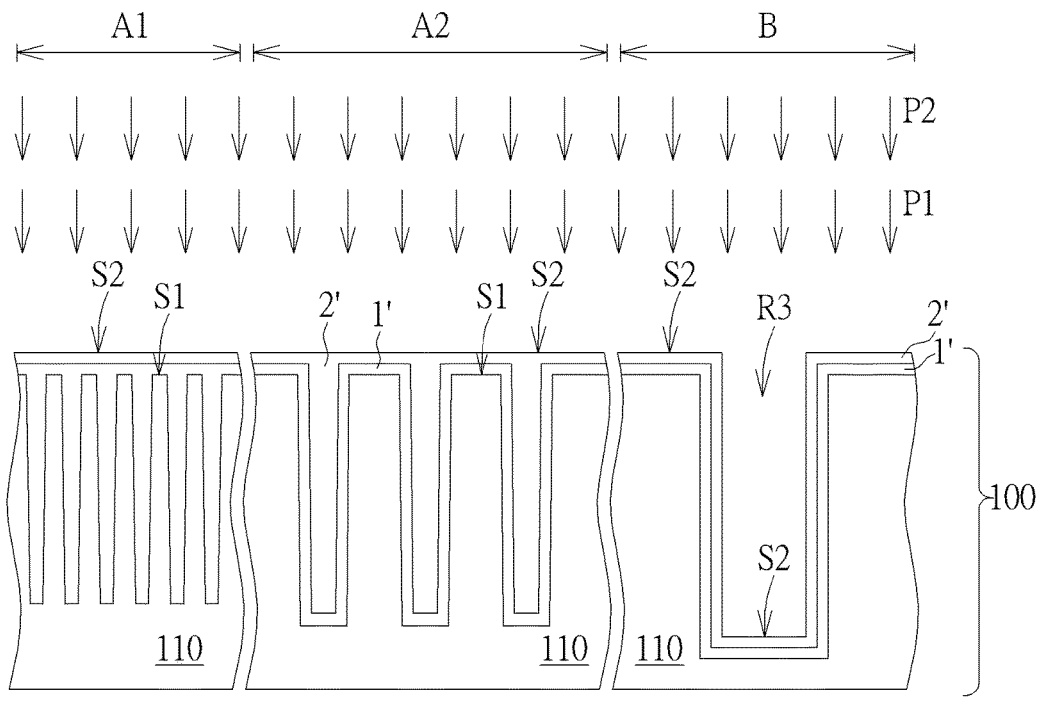

As shown in FIG. 3, a particle removing process P1 is selectively performed to remove remaining particles left after previous processes such as processes for forming the recesses R1/R2/R3. The particle removing process P1 may include a high pressure cleaning process, but it is not limited thereto.

A pre-treatment process P2 is then performed to treat the surface S2 of the substrate 100, thereby an oxygen ion-rich surface being formed at the surface S2 of the substrate 100. The pre-treatment process P2 may include a wet pre-treatment process, a dry pre-treatment process, or a wet pre-treatment process and a dry pre-treatment process. In one case, the surface S2 of the substrate 100 is treated by a wet pre-treating process, and the wet pre-treatment process preferably includes a solution of hydrogen peroxide ($H_2O_2$), thereby the surface S2 can be an oxygen ion-rich surface. In another case, the surface S2 of the substrate 100 is treated by a dry pre-treatment process, and the dry pre-treatment process preferably includes having oxygen containing gas imported, thereby the surface S2 can be an oxygen ion-rich surface. In a still preferred embodiment, the oxygen containing gas may include oxygen gas ($O_2$), ozone gas ($O_3$), or oxygen gas ($O_2$) and ozone gas ($O_3$) imported sequentially or simultaneously. The dry pre-treatment process is preferably performed at a temperature lower than 500° C., but it is not limited thereto. In this way, a flowable dielectric material later coated on the oxygen ion-rich surface can be transformed into an oxide layer completely. Specifically, the flowable dielectric material at the bottom of the recesses R1/R2/R3 can be transformed into the oxide layer completely. Hence, this improves gap filling of the oxide layer, avoids voids in the oxide layer, and enhances the material uniformity of the oxide layer.

Figure 4:
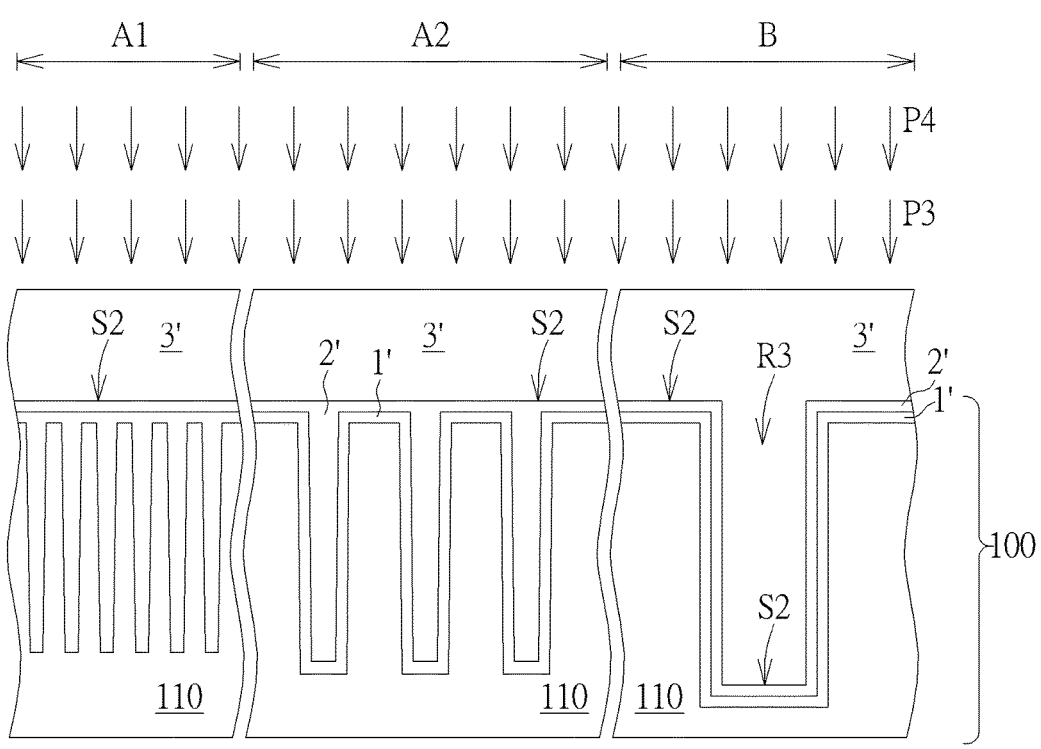

As shown in FIG. 4, a spin-on-dielectric layer 3' is formed on the oxygen ion-rich surface S2 of the substrate 100. Methods of forming the spin-on-dielectric layer 3' include the following. A spin-on-coating process P3 and then an annealing process P4 may be performed. A flowable dielectric material is spin-coated on the substrate 110 and in the recess R3 through the spin-on-coating process P3, and thus the recess R3 is filled up. Then, the annealing process P4 is performed to solidify the flowable dielectric material into the spin-on-dielectric layer 3' and to densify the spin-on-dielectric layer 3'. In this embodiment, the spin-on-dielectric layer 3' is an oxide layer formed by spin-coated, but it is not limited thereto. As the pre-treatment process P2 is a wet pre-treatment process, the annealing process is preferably performed at a temperature lower than 900° C. As the pre-treatment process P2 is a dry pre-treatment process, the annealing process is preferably performed at a temperature lower than 600° C.

Figure 5:
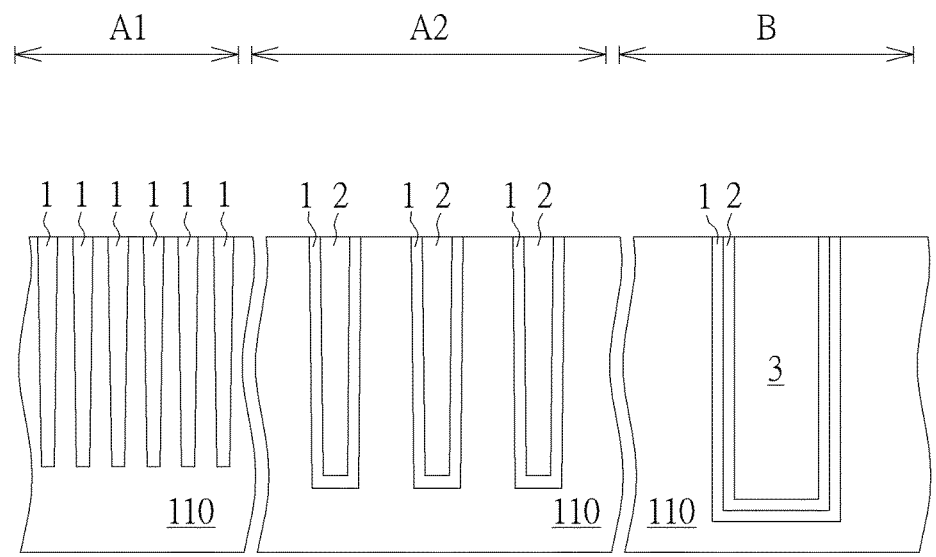

As shown in FIG. 5, a planarization process is performed to planarize the spin-on-dielectric layer 3', the nitride liner 2' and the oxide liner 1', thereby an oxide liner 1, an nitride liner 2 and a spin-on-dielectric layer 3 may be formed. In this embodiment, the oxide liner 1, the nitride liner 2 and the spin-on-dielectric layer 3 constitute a shallow trench isolation layer, meaning the isolation structures isolating recessed dynamic random access memory (DRAM) cells from each other, but the present invention is not restricted thereto. In this embodiment, the oxide liner 1 fills up the recess R1 in the first area A1, and partially fills the recess R2 in the second area A2 and the recess R3 in the third area B. The nitride liner 2 fills up the recess R2 in the second area A2 and partially fills the recess R3 in the third area B. The spin-on-dielectric layer 3 fills up the recess R3.

Figure 6:
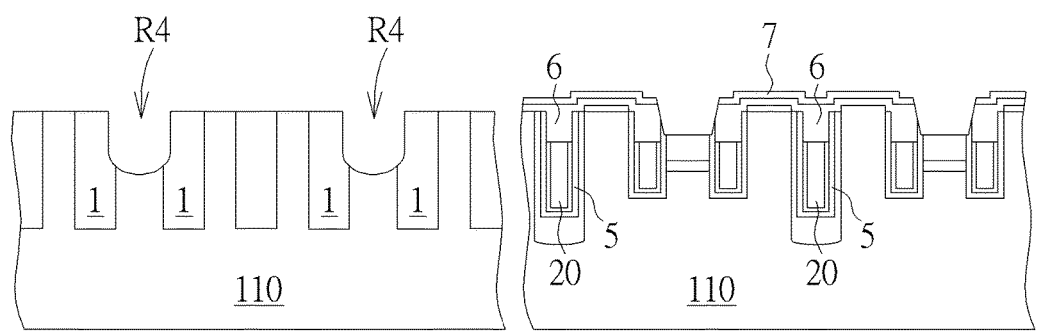
FIGS. 6-10 schematically depict cross-sectional views of a method of forming a dynamic random access memory (DRAM) according to an embodiment of the present invention.

FIGS. 6-10 schematically depict cross-sectional views of a method of forming a dynamic random access memory (DRAM) according to an embodiment of the present invention, wherein the left diagrams and the right diagrams of FIGS. 6-10 are cross-sectional views orthogonal to each other. As shown in FIG. 6, the oxide liner 1 of the first area A1 in FIG. 5 constitutes the shallow trench isolation layer of the recessed dynamic random access memory (DRAM) cells in this area. A plurality of buried word lines 20 are disposed in the substrate 110, and then recesses R4 are formed in the substrate 110 for forming word line contacts in later processes. Isolation materials such as silicon oxide layer 5, silicon nitride layer 6 and silicon oxide layer 7 may cover the surface of the substrate 110, but it is not limited thereto.

Figure 7:
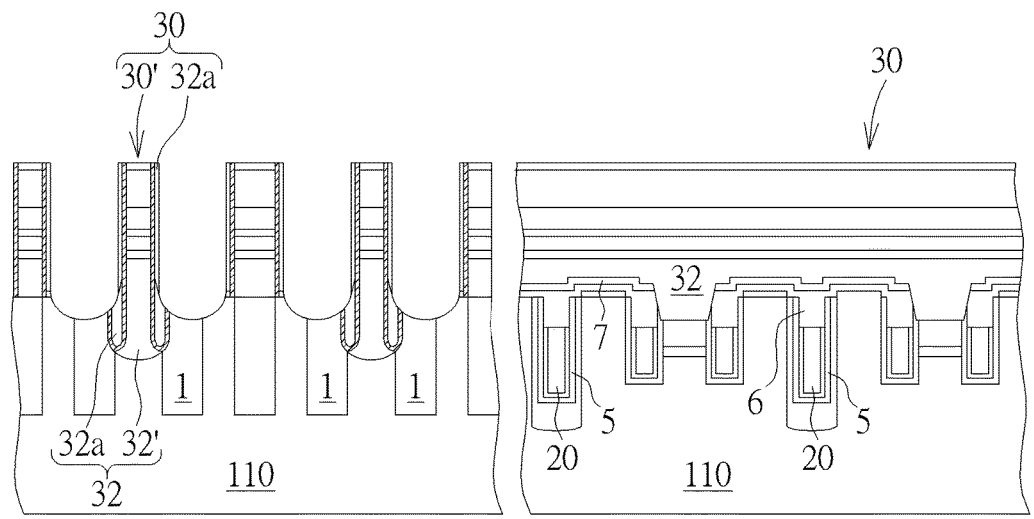

As shown in FIG. 7, bit line gates 30 are formed on the substrate 110, wherein the bit line gates 30 are preferably disposed on the substrate 110 and cover the plurality of buried word lines 20 embedded in the substrate 110. Methods of forming the bit line gates 30 may include stacking a plurality of material layers on the substrate 110 blanketly, wherein the material layers may include an amorphous silicon layer and a stacked metal layer from bottom to top, but it is not limited thereto. The stacked metal layer may include a titanium layer, a titanium nitride layer, a first tungsten nitride layer and a tungsten layer stacked from bottom to top. Then, the material layers are patterned to form bit line gates 30', thereby bottoms of the bit line gates 30' have bit line contacts 32 formed. Moreover, spacers 32a may cover both opposite sides of the bit line gates 30' to form the bit line gates 30. The spacers 32a may be silicon nitride spacers, but it is not limited thereto. By doing this, the bit line gates 30 have bit line contacts 32 formed. Each of the bit line gates 30' and its corresponding word line contact 32 are one piece.

Figure 8:
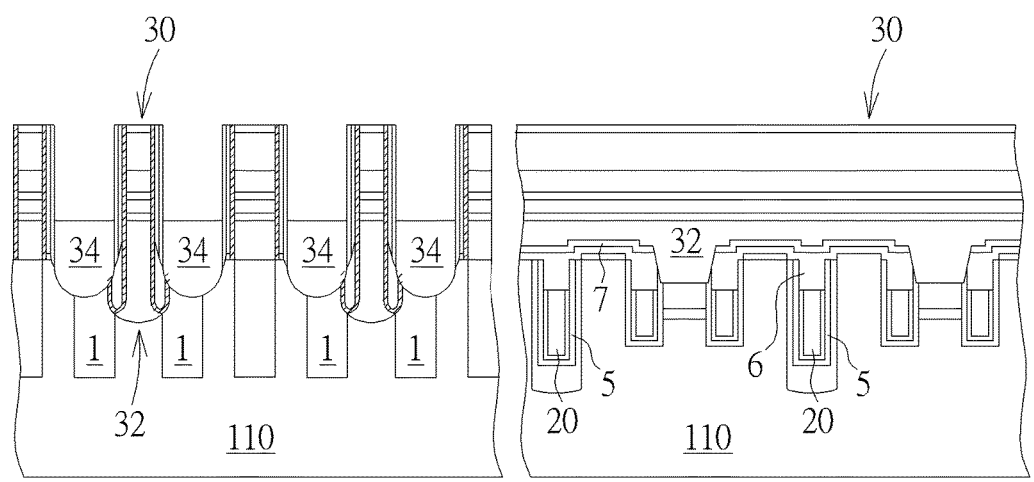

As shown in FIG. 8, storage node contacts 34 are formed in the substrate 110 beside the bit line contacts 32. Methods of forming the storage node contacts 34 may include etching the substrate 110 beside the bit line contacts 32 to form recesses, and then forming the storage node contacts 34 in the recesses, but it is not limited thereto.

Figure 9:
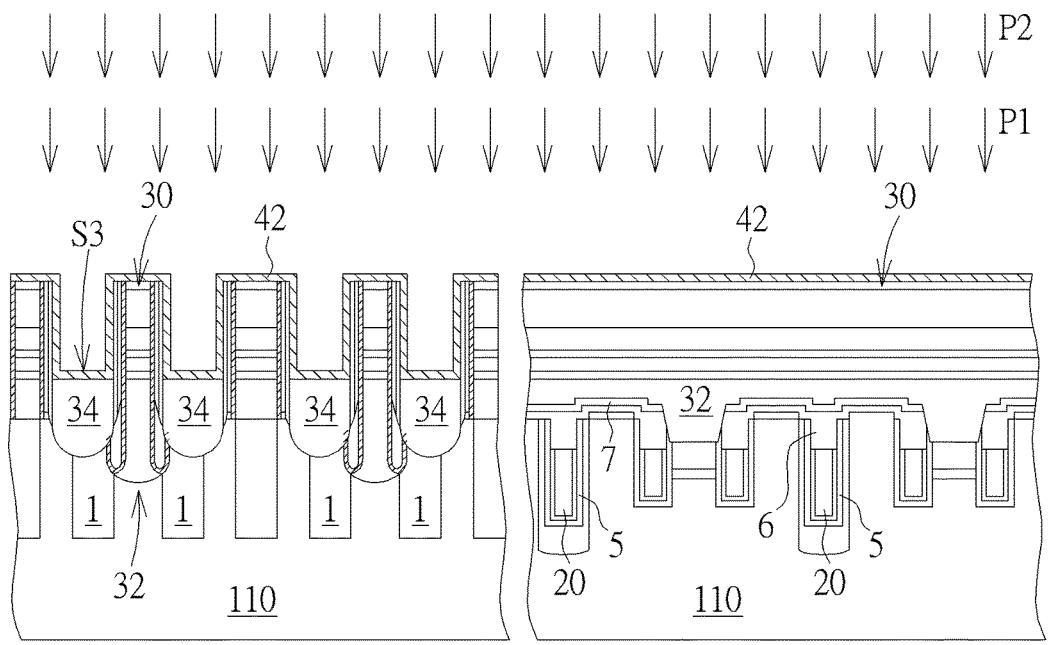
Figure 10:
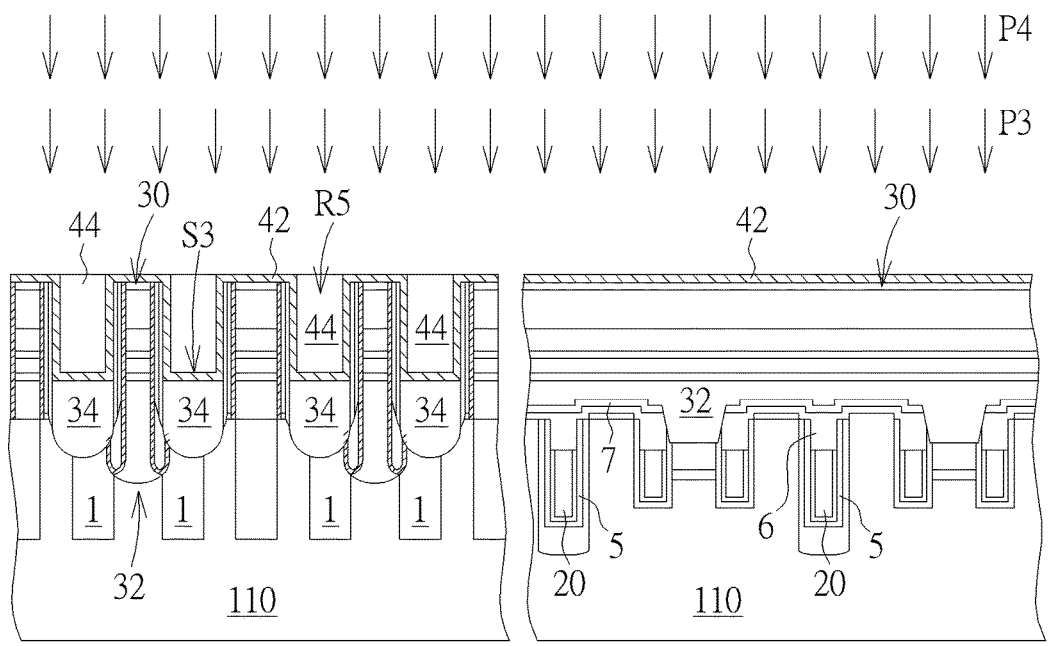

FIGS. 9-10 depict a method of forming an interlayer dielectric layer applying the method of the present invention depicted in FIGS. 2-5. As shown in FIG. 9, a liner 42 is formed to cover the substrate 110, the bit line gates 30 and the storage node contacts 34. The liner 42 may be one layer or multilayers, which may be an oxide liner, a nitride liner, a carbon containing nitride liner, an oxynitride liner or combinations of these liners.

Thereafter, the particle removing process P1 of FIG. 3 is performed to remove remaining particles between the bit line gates 30 and on the storage node contacts 34 left after previous processes. The particle removing process P1 may include a high pressure cleaning process, but it is not limited thereto.

Then, the pre-treatment process P2 of FIG. 3 is then performed to treat a surface S3 of the liner 42, thereby an oxygen ion-rich surface is formed at the surface S3 of the liner 42. The pre-treatment process P2 may include a wet pre-treatment process, a dry pre-treatment process, or a wet pre-treatment process and a dry pre-treatment process. In one case, the surface S3 of the liner 42 is treated by a wet pre-treating process, and the wet pre-treatment process preferably includes a solution of hydrogen peroxide ($H_2O_2$), thereby the surface S3 can be an oxygen ion-rich surface. In another case, the surface S3 of the liner 42 is treated by a dry pre-treatment process, and the dry pre-treatment process preferably includes having oxygen containing gas imported, thereby the surface S3 can be an oxygen ion-rich surface. In a still preferred embodiment, the oxygen containing gas may include oxygen gas ($O_2$), ozone gas ($O_3$), or oxygen gas ($O_2$) and ozone gas ($O_3$) imported sequentially or simultaneously. The dry pre-treatment process is preferably performed at a temperature lower than 500° C., but it is not limited thereto. In this way, a flowable dielectric material later coated on the oxygen ion-rich surface can be transformed into an oxide layer completely. Specifically, the flowable dielectric material at the bottoms of the recesses can be transformed into an oxide layer completely. Hence, this improves gap filling of the oxide layer, avoids voids in the oxide layer, and enhances the material uniformity of the oxide layer.

As shown in FIG. 10, a spin-on-dielectric layer 44 is formed on the oxygen ion-rich surface S3 of the liner 42. Methods of forming the spin-on-dielectric layer 44 include the following. A spin-on-coating process P3 and then an annealing process P4 may be performed. A flowable dielectric material is spin-coated on the liner 42 and in the recesses R5 through the spin-on-coating process P3, and thus the recesses R5 are filled up. Then, the annealing process P4 is performed to solidify the flowable dielectric material into the spin-on-dielectric layer 44 and to densify the spin-on-dielectric layer 44. In this embodiment, the spin-on-dielectric layer 44 is an oxide layer formed by spin-coated, but it is not limited thereto. As the pre-treatment process P2 is a wet pre-treatment process, the annealing process is preferably performed at a temperature lower than 900° C. As the pre-treatment process P2 is a dry pre-treatment process, the annealing process is preferably performed at a temperature lower than 600° C. Then, a planarization process is performed to planarize the spin-on-dielectric layer 44 until top surfaces of the spin-on-dielectric layer 44 trim top surfaces of the liner 42, but it is not limited thereto.

To summarize, the present invention provides a method of forming an oxide layer, which treats a surface of a substrate by a dry treatment process or a wet treatment process to form an oxygen ion-rich surface, and then forms an oxide layer on the surface. By doing this, a flowable dielectric material used for forming the oxide layer can be transformed completely, especially for the flowable dielectric material being transformed at the bottom of a recess completely. Therefore, this improves gap filling of the oxide layer, avoids voids in the oxide layer, and enhances the material uniformity of the oxide layer.

Moreover, the wet pre-treating process may include a solution of hydrogen peroxide ($H_2O_2$), and the dry pre-treatment process may include having oxygen containing gas imported, wherein the oxygen containing gas may include oxygen gas ($O_2$), ozone gas ($O_3$) or their combinations, but it is not limited thereto. Before the surface of the substrate is treated, a particle removing process may be selectively performed, wherein the particle removing process may include a high pressure cleaning process to remove particles remaining after previous processes.

Methods of forming the oxide layer on the oxygen ion-rich surface may include performing a spin-on-coating process and then an annealing process. The flowable dielectric material is spin-coated on the oxygen ion-rich surface, especially on the oxygen ion-rich surface of the recess, through the spin-on-coating process. Then, the annealing process is performed to solidify the flowable dielectric material into the oxide layer and to densify the oxide layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an oxide layer, comprising:
providing a substrate comprising a first recess and a second recess, wherein the opening of the first recess is smaller than the opening of the second recess;
forming a liner conformally covering the first recess, the second recess and the substrate;
treating a surface of the liner being formed by an atomic layer deposition (ALD) process to form an oxygen ion-rich surface, wherein the liner fills up the first recess, but partially fills the second recess; and
forming a spin-on-dielectric layer on the oxygen ion-rich surface of the liner, wherein the liner and the spin-on-dielectric layer are formed by different processes.

2. The method of forming an oxide layer according to claim 1, wherein the surface of the substrate is treated by a wet pre-treating process.

3. The method of forming an oxide layer according to claim 2, wherein the wet pre-treating process comprises a solution of hydrogen peroxide (H2O2).

4. The method of forming an oxide layer according to claim 1, wherein the surface of the substrate is treated by a dry pre-treatment process.

5. The method of forming an oxide layer according to claim 4, wherein the dry pre-treatment process comprises having oxygen containing gas imported.

6. The method of forming an oxide layer according to claim 5, wherein the oxygen containing gas comprises oxygen gas (O2) or/and ozone gas (O3).

7. The method of forming an oxide layer according to claim 4, wherein the dry pre-treatment process is performed at a temperature lower than 500° C.

8. The method of forming an oxide layer according to claim 1, further comprising:
performing a particle removing process before the surface of the substrate is treated.

9. The method of forming an oxide layer according to claim 1, wherein the oxide layer comprises a shallow trench isolation layer or an interlayer dielectric layer.

10. The method of forming an oxide layer according to claim 3, wherein the liner comprises at least one of an oxide liner and a nitride liner.

11. The method of forming an oxide layer according to claim 5, wherein the spin-on-dielectric layer is formed by a spin-on-coating process and then an annealing process.

12. The method of forming an oxide layer according to claim 11, wherein the annealing process is performed at a temperature lower than 600° C.

13. The method of forming an oxide layer according to claim 5, wherein the liner comprises at least one of a carbon containing nitride liner and an oxynitride liner.

14. The method of forming an oxide layer according to claim 1, wherein the substrate comprises recesses, and the liner conformally covers the recesses and the substrate, and further comprising:
    performing a planarization process to completely remove the spin-on-dielectric layer and the liner exceeding from the recesses after the spin-on-dielectric layer is formed.

* * * * *